(12) United States Patent
Lin et al.

(10) Patent No.: US 8,729,962 B2
(45) Date of Patent: May 20, 2014

(54) MILLIMETER WAVE POWER AMPLIFIER

(75) Inventors: Saihua Lin, Sunnyvale, CA (US);
Yongwang Ding, Milipitas, CA (US);
Cheol-Woong Lee, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 39 days.

(21) Appl. No.: 13/327,479

(22) Filed: Dec. 15, 2011

(65) Prior Publication Data
US 2013/0154747 A1  Jun. 20, 2013

(51) Int. Cl.
*H03F 1/24* (2006.01)

(52) U.S. Cl.
USPC ............................................. 330/100; 330/98

(58) Field of Classification Search
USPC ................................. 330/100, 99, 98, 150, 310
See application file for complete search history.

(56) References Cited

U.S. PATENT DOCUMENTS

| | | | |
|---|---|---|---|
| 3,715,678 A * | 2/1973 | Reichard | 330/86 |
| 3,972,002 A | 7/1976 | Aprille, Jr. | |
| 5,166,639 A * | 11/1992 | Green et al. | 330/294 |
| 5,453,704 A * | 9/1995 | Kawashima | 326/81 |
| 5,469,114 A | 11/1995 | Saxena | |
| 6,150,884 A | 11/2000 | Fattaruso | |
| 6,429,739 B1 | 8/2002 | Olsson | |
| 6,489,843 B1 | 12/2002 | Nishijima et al. | |
| 6,633,751 B1 | 10/2003 | Damgaard et al. | |
| 6,941,118 B2 | 9/2005 | Yamamoto | |
| 7,061,313 B2 | 6/2006 | Kimball et al. | |
| 7,116,164 B1 * | 10/2006 | Aram | 330/99 |
| 7,173,486 B1 | 2/2007 | Sutardja | |
| 7,183,842 B1 | 2/2007 | Wai et al. | |
| 7,212,070 B2 | 5/2007 | Westwick et al. | |
| 7,276,965 B1 * | 10/2007 | Sutardja | 330/98 |
| 7,385,447 B1 | 6/2008 | Adar | |
| 7,388,428 B2 | 6/2008 | Wiegner et al. | |
| 7,423,483 B1 | 9/2008 | Voo | |
| 7,508,264 B1 | 3/2009 | Terrovitis | |
| 7,696,820 B1 * | 4/2010 | Voo | 330/109 |
| 7,940,120 B2 | 5/2011 | Grebennikov et al. | |
| 8,149,049 B2 * | 4/2012 | Takeuchi | 330/51 |
| 8,330,551 B2 * | 12/2012 | Lim et al. | 333/33 |
| 2007/0176686 A1 | 8/2007 | Fu et al. | |
| 2008/0211575 A1 | 9/2008 | Beaulaton et al. | |
| 2008/0218271 A1 | 9/2008 | Mitzlaff et al. | |
| 2011/0163804 A1 | 7/2011 | Li | |

FOREIGN PATENT DOCUMENTS

WO    2008039503 A2    4/2008

OTHER PUBLICATIONS

International Search Report and Written Opinion—PCT/US2012/069944—ISA/EPO—Feb. 20, 2013.
Park J-D et al., "Ladder-shaped Network for ESD protection of millimetre-wave CMOS ICs", Electronic Letters, The Institution of Engineering and Technology, vol. 45, No. 15, Jul. 16, 2009, pp. 795-797, XP006033556.

\* cited by examiner

*Primary Examiner* — Henry Choe
(74) *Attorney, Agent, or Firm* — Ramin Mobarhan

(57) ABSTRACT

A millimeter wave power amplifier is disclosed. In an exemplary embodiment, a MM wave power amplifier (PA) includes a plurality of amplifier stages coupled together to receive a MM wave input signal and produce an amplified MM wave output signal, and one or more feedback elements coupled across the amplifier stages, each feedback element coupled across an odd number of the amplifier stages to increase an operating bandwidth of the PA.

24 Claims, 5 Drawing Sheets

MILLIMETER WAVE POWER AMPLIFIER

BACKGROUND

1. Field

The present application relates generally to the operation and design of amplifiers, and more particularly, to a power amplifier configured to operate at millimeter (MM) wave frequencies.

2. Background

There is an increasing demand to have mobile devices capable of high quality transmission and reception. One key to achieving high quality is associated with the performance of the power amplifier. For example, it is desirable to have a high performance power amplifier in a mobile device that can operate at frequencies in the millimeter wavelength range, which is extremely high frequency in the range of 30 to 300 gigahertz. This high frequency band has a wavelength of ten to one millimeters.

A large bandwidth (typically greater than 8 GHz) power amplifier (PA) is required to operate at these frequencies. However, conventional open loop designs fail to achieve large bandwidth, high linearity, and low power simultaneously. Therefore, it is desirable to have a small size and low cost MM wave power amplifier for use in mobile devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

The exemplary embodiments disclosed herein provide a MM wave power amplifier that achieves large bandwidth (approximately 25 GHz), good linearity, and low power consumption. For example, the disclosed power amplifier utilizes a multistage architecture with weak negative feedback to achieve large bandwidth with high gain. In an exemplary embodiment, interleaved double feedback loops are used to provide bandwidth improvements over conventional systems.

Figure 1:
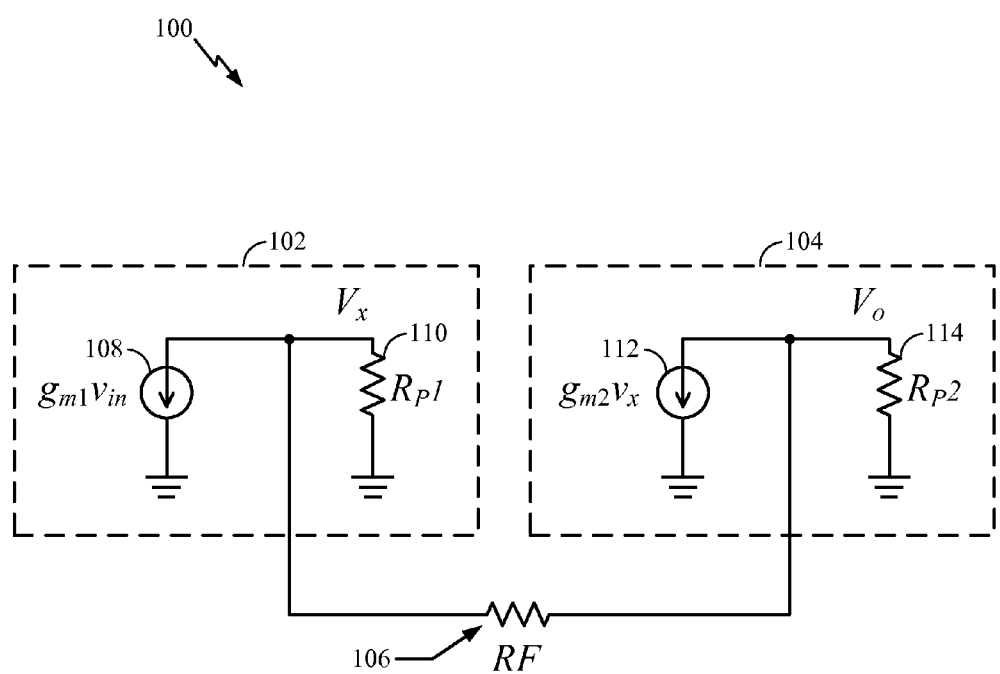
FIG. 1 shows an exemplary model of a MM wave power amplifier.

FIG. 1 shows an exemplary model of a MM wave power amplifier 100. The amplifier 100 comprises a first stage 102 coupled to a second stage 104 by a feedback element 106. In an exemplary embodiment, a resistor is used as the feedback element 106. However, the feedback element 106 can also comprise other components like capacitors or inductors.

The first stage 102 comprises a current source 108 that generates a current based on an input voltage and has a value of $(g_{m1} * V_{in})$. A first terminal of the current source 108 is connected to a first terminal of resistor $(R_{p1})$ 110, which results in an intermediate voltage $V_x$. A second terminal of the current source 108 is connected to ground. The resistor 110 also has a second terminal connected to ground.

The second stage 104 comprises a current source 112 that generates a current based on the intermediate voltage $V_x$ and has a value of $(g_{m2} * V_x)$. A first terminal of the current source 112 is connected to a first terminal of resistor $(R_{p2})$ 114, which results in an output voltage $V_o$. A second terminal of the current source 112 is connected to ground. The resistor 114 also has a second terminal connected to ground.

The feedback element 106 is connected between the first terminal of the resistor 110 and the first terminal of the resistor 114. The model of the MM wave power amplifier 100 can be used to determine the gain, which is the relationship between the output voltage $V_o$ and the input voltage $V_{in}$. If $R_{P2}$ comprises an LC tank circuit, the gain can be expressed as follows.

$$\frac{v_o}{v_{in}} = -g_{m1} R_{p1} \frac{g_{m2} - \frac{1}{R_F}}{\frac{1}{j\omega L} + j\omega C + \frac{1}{R_{P2}} + \frac{1}{R_F}} \approx g_{m1} R_{p1} \frac{g_{m2} - \frac{1}{R_F}}{j2C\Delta\omega + \frac{1}{R_{P2}} + \frac{1}{R_F}} \quad (1)$$

As the value of the feedback resistor 106 is increased to infinity, the gain $(V_o/V_{in})$ approaches $[-g_{m1} * R_{p1} * g_{m2} * R_{p2}]$. Thus, from equation (1), the factor $[1/R_F]$ operates to reduce the gain of the amplifier but also to increase the bandwidth. For example, the bandwidth (BW) of the amplifier can be expressed as follows.

$$BW \approx \frac{\frac{1}{R_{P2}} + \frac{1}{R_F}}{C} \quad (2)$$

Thus, if RF is infinite, which means no feedback, then the BW=$(1/R_{P2}/C)$. If RF is reduced from infinity, then the BW is increased. The characteristics of the model shown in FIG. 1 are used in exemplary embodiments of a MM wave power amplifier shown below.

Figure 2:
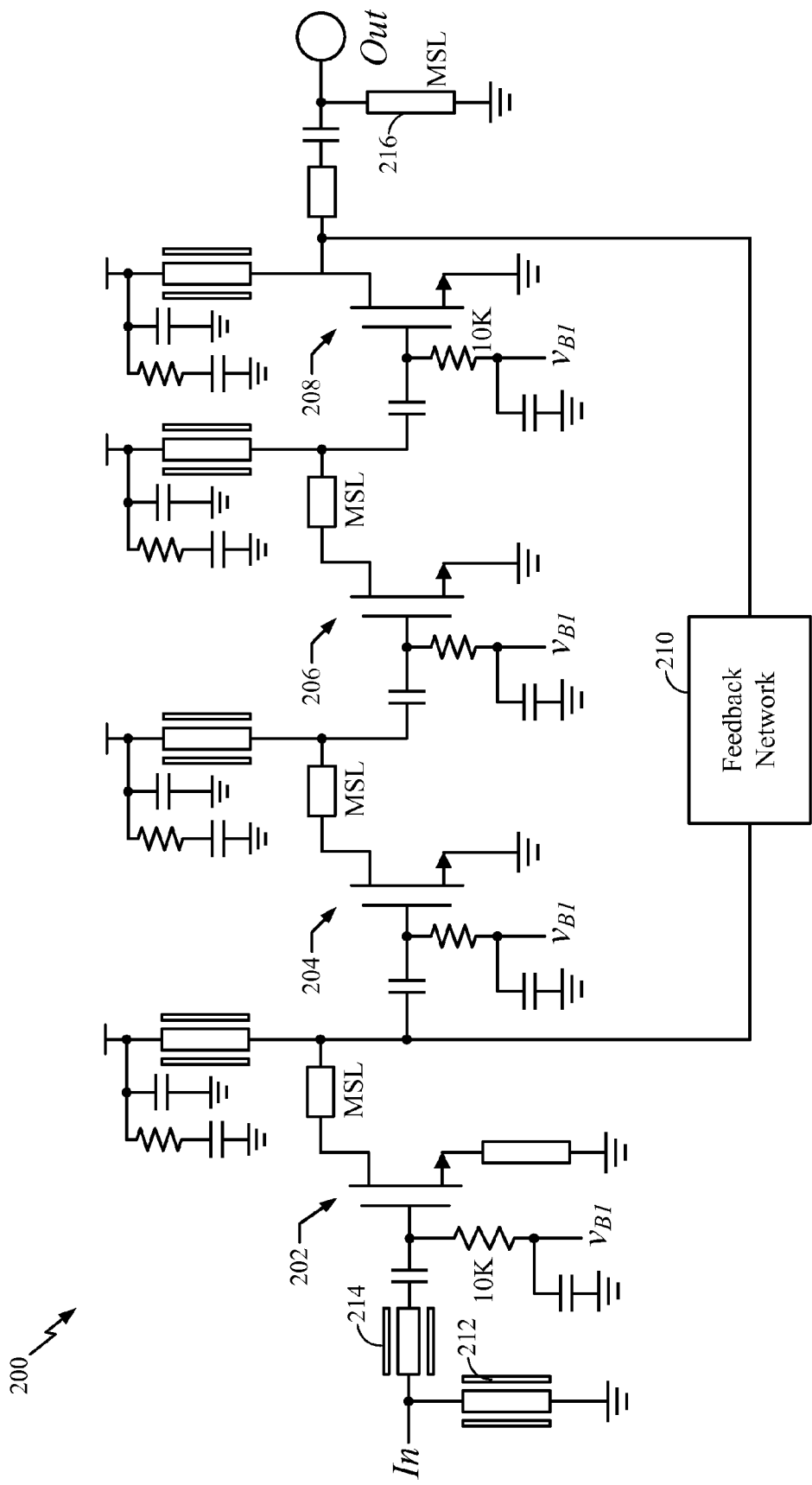
FIG. 2 shows an exemplary embodiment of a MM wave PA.

FIG. 2 shows an exemplary embodiment of a MM wave PA 200. The PA 200 comprises four stages 202, 204, 206, and 208 coupled together by micro strip lines (MSL). The PA 200 also includes a single feedback path that comprises a feedback network 210. In an exemplary embodiment, a resistor is used as the feedback network; however, the feedback network can also comprise other components like capacitors or inductors. The feedback network 210 is coupled between the output of the fourth stage and the input to the second stage. In exemplary embodiments, the feedback network 210 is coupled around an odd number of stages.

In an exemplary embodiment, the MM wave PA 200 provides an input matching network that comprises coplanar waveguide (CPW) 212 and 214. The CPW 212 is coupled to ground and therefore provides electrostatic discharge (ESD) protection for the PA input. In an exemplary embodiment, the MM wave PA 200 comprises an output matching network comprising MSL 216 that is coupled between the output and ground. The MSL 216 also provides ESD protection for the PA output. In exemplary embodiments, the CPW 212, 214 and the MSL 216 can comprise inductors.

Figure 3:
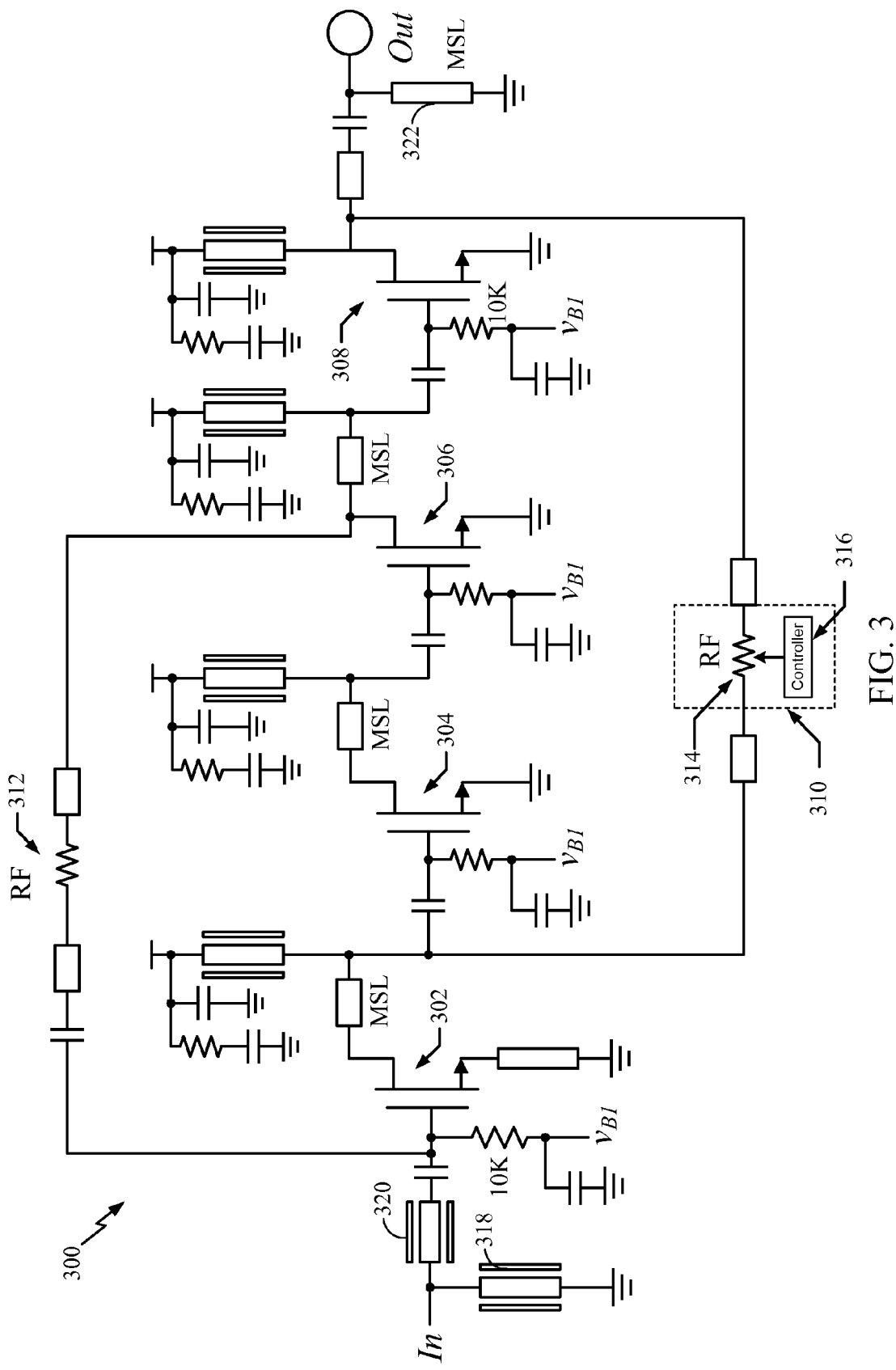
FIG. 3 shows an exemplary embodiment of a MM wave PA.

FIG. 3 shows an exemplary embodiment of a MM wave PA 300. The PA 300 comprises four stages 302, 304, 306, and 308 coupled together by MSLs. The PA 300 includes interleaved dual feedback paths that comprise a first feedback network 310 and a second feedback network 312. In an exemplary embodiment, the feedback networks comprise a resistor, but other components may also be used.

The first feedback network 310 is coupled between the output of the fourth stage and the output of the first stage. In an exemplary embodiment, the feedback network 310 comprises a variable resistor 314 and a controller 316. The controller 316 operates to set the value of the variable resistor 314 to obtain a selected operating bandwidth for the amplifier 300. In an exemplary embodiment, the controller comprises a CPU, processor, gate array or other hardware components configured to set the resistance value of the variable resistor 314 to achieve the selected operating bandwidth for the amplifier 300.

The second feedback network 312 is coupled between the output of the third stage and the input of the first stage. The second feedback network 312 comprises a fixed resistor, but in other implementations, may also comprise a variable resistor and controller as provided by the feedback network 310. The use of passive feedback components provide for weak negative feedback directly from the PA output (i.e., output of stage 308). In an exemplary embodiment, the feedback networks are resistors whose values are chosen to provide a loop gain of less than zero dB. However, the feedback networks may comprise variable resistors or other components.

During operation, various embodiments of the MM wave PA provide bandwidth improvements over conventional circuits. For example, in one case, a conventional circuit without feedback provides a bandwidth of 6.1 GHz, a MM wave PA with one feedback path as disclosed herein provides a bandwidth of 12.2 GHz, which is a 100% increase over the conventional circuit. In still another case, a MM wave PA with interleaved double feedback paths as disclosed herein provides a bandwidth larger than 17.2 GHz, which is a 182% increase over the conventional circuit. Thus, weak negative feedback as disclosed herein can be used with a MM wave PA that comprises multiple stages, where each feedback path is coupled around an odd number of stages.

In an exemplary embodiment, the MM wave PA 300 provides an input matching network that comprises CPW 318 and 320. The CPW 318 is coupled to ground and therefore provides ESD protection for the PA input. In an exemplary embodiment, the MM wave PA 300 comprises an output matching network comprising MSL 322 that is coupled between the output and ground. The MSL 322 also provides ESD protection for the PA output. In exemplary embodiments, the CPW 318, 320 and the MSL 322 can comprise inductors.

Figure 4:
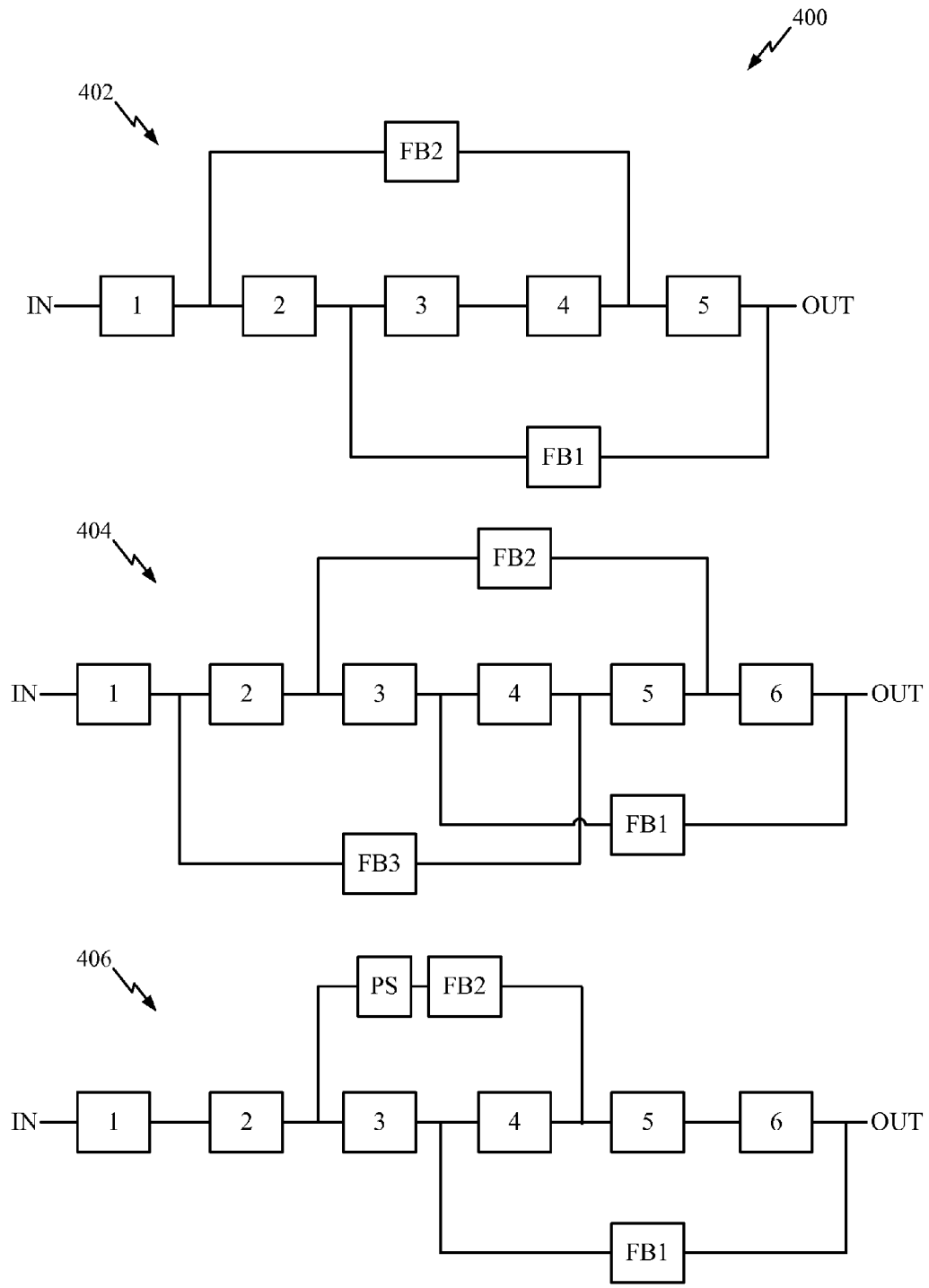
FIG. 4 shows an exemplary block diagrams illustrating alternative configurations for a MM wave power amplifier.

FIG. 4 shows an exemplary block diagrams 400 illustrating alternative configurations for a MM wave PA. In a first exemplary embodiment of a MM wave PA shown at 402, five amplifier stages (1-5) are used. A dual interleaved feedback configuration is shown where a first feedback element (FB1) is coupled between the output of the fifth stage and the input of the third stage. A second feedback element (FB2) is coupled between the output of the fourth stage and the input of the second stage. The feedback elements may be fixed resistors, variable resistors with a controller, or comprise other components. Thus, the two feedback elements are used and each feedback element is coupled around an odd numbers of stages to provide for increased bandwidth in accordance the model of FIG. 1.

In a second embodiment of a MM wave PA shown at 404, six amplifier stages are used. A triple interleaved feedback configuration is shown where a first feedback element (FB1) is coupled between the output of the sixth stage and the input of the fourth stage. A second feedback element (FB2) is coupled between the output of the fifth stage and the input of the third stage. A third feedback element (FB3) is coupled between the output of the fourth stage and the input of the second stage. The feedback elements may be fixed resistors, variable resistors with a controller, or comprise other components.

In alternative exemplary embodiments, feedback can be coupled around an even number of stages if a selected amount of phase shift is introduced. For example, a feedback path that comprises a resistor coupled around an odd number of stages may be reconfigured to be coupled around an even number of stages if a selected amount of phase shift is provided in the feedback path. For example, an LC tank circuit may be used to provide the desired phase shift. Accordingly, it is possible to have an interleaved feedback configuration using feedback paths coupled around both even and odd numbers of stages.

In a third embodiment of a MM wave PA shown at 406, six amplifier stages are used. A double interleaved feedback configuration is shown where a first feedback element (FB1) is coupled between the output of the sixth stage and the input of the fourth stage. A second feedback element (FB2) is coupled between the output of the fourth stage and the input of the third stage. This means that the second feedback element (FB2) is coupled around an even number of stages. In an exemplary embodiment, a phase shifter (PS) is provided to introduce a selected amount of phase shift in the second feedback path. The amount of phase shift introduced will compensate for the feedback path being coupled around an even number of stages. Thus, the phase shift will result in the second feedback element (FB2) having an effect as if it was coupled around an odd number of stages in accordance with the embodiments disclosed herein.

Thus, in various exemplary embodiments, weak negative feedback as described herein can be used in a multiple stage MM wave amplifier to increase the bandwidth of the amplifier. Each of the feedback elements is coupled around odd numbers of stages to improve the bandwidth of the amplifier. In an exemplary embodiment, a feedback element may be coupled around an even number of stages if the appropriate phase shift is introduced in the feedback path.

Figure 5:
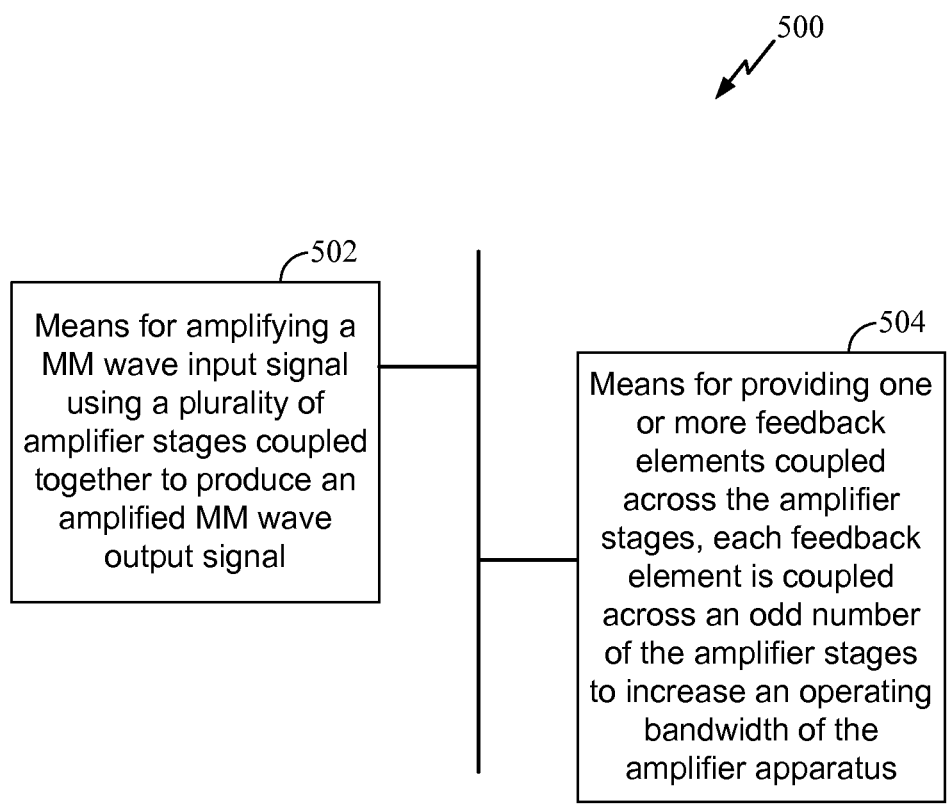
FIG. 5 shows an exemplary embodiment of a MM wave power amplifier apparatus.

FIG. 5 shows an exemplary embodiment of a MM wave power amplifier apparatus 500. For example, the apparatus 500 is suitable for use as the MM wave PA 300 shown in FIG. 3. In an aspect, the apparatus 500 is implemented by one or more modules configured to provide the functions as described herein. For example, in an aspect, each module comprises hardware and/or hardware executing software.

The apparatus 500 comprises a first module comprising means (502) for amplifying a MM wave input signal using a plurality of amplifier stages coupled together to produce an amplified MM wave output signal, which in an aspect comprises the amplifier 300.

The apparatus 500 also comprises a second module comprising means (504) for providing one or more feedback elements coupled across the amplifier stages, each feedback network is coupled across an odd number of the amplifier stages to increase an operating bandwidth of the amplifier apparatus 500, which in an aspect comprises the feedback elements 310 and 312.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
    a plurality of amplifier stages coupled together to receive a millimeter (MM) wave input signal and produce an amplified MM wave output signal; and
    two or more feedback elements coupled across the amplifier stages to form two or more interleaved feedback paths, respectively, each feedback path connecting a selected amplifier output to a selected amplifier input that are different from other feedback paths, and wherein at least one feedback path spans an odd number of three or more amplifier stages to increase an operating bandwidth.

2. The apparatus of claim 1, the one or more feedback elements selected to provide a loop gain less than zero.

3. The apparatus of claim 1, each feedback element comprising a fixed resistor having a resistance value set to achieve a desired operating bandwidth.

4. The apparatus of claim 1, each feedback element comprising a variable resistor having a resistance value set to achieve a desired operating bandwidth.

5. The apparatus of claim 1, at least one feedback element comprising a fixed resistor and at least a second feedback element comprising a variable resistor, the fixed resistor and the variable resistor having resistance values set to achieve a desired operating bandwidth.

6. The apparatus of claim 1, the plurality of amplifier stages comprising four amplifier stages and the two or more interleaved feedback paths comprising an interleaved double feedback having a first feedback element coupled between an output of a fourth amplifier stage and an input of a second amplifier stage, and a second feedback element coupled between an output of a third amplifier stage and an input of a first amplifier stage.

7. The apparatus of claim 6, the first feedback element and the second feedback element selected to provide a loop gain less than zero.

8. The apparatus of claim 6, the first feedback element and the second feedback element comprising fixed resistors having resistance values set to achieve a desired operating bandwidth.

9. The apparatus of claim 1, further comprising an input matching network comprising a coplanar waveguide (CPW) that couples an input of at least one amplifier stage to ground to provide electrostatic discharge (ESD) protection.

10. The apparatus of claim 1, further comprising an output matching network comprising a micro strip line (MSL) that couples an output of at least one amplifier stage to ground to provide ESD protection.

11. The apparatus of claim 1, further comprising:
a selected feedback element coupled across an even number of amplifier stages; and
a phase shifter coupled between the selected feedback element and a selected amplifier stage, the phase shifter configured to introduce a selected amount of phase shift to cause the selected feedback element to act as if coupled around a selected odd number of amplifier stages.

12. An apparatus comprising:
means for amplifying a millimeter (MM) wave input signal using a plurality of amplifier stages coupled together to produce an amplified MM wave output signal; and
means for providing two or more feedback elements coupled across the amplifier stages to form two or more interleaved feedback paths, respectively, each feedback path connecting a selected amplifier output to a selected amplifier input that are different from other feedback paths, and wherein at least one feedback path spans an odd number of three or more amplifier stages to increase an operating bandwidth.

13. The apparatus of claim 12, the means for providing comprising means for providing the one or more feedback elements to provide a loop gain less than zero.

14. The apparatus of claim 12, the means for providing comprising means for providing each feedback element with a resistance value set to achieve a desired operating bandwidth.

15. The apparatus of claim 12, the means for providing comprising means for providing each feedback element with a variable resistance value set to achieve a desired operating bandwidth.

16. The apparatus of claim 12, the means for providing comprising means for providing at least one feedback element comprising a fixed resistance and at least a second feedback element comprising a variable resistance that are set to achieve a desired operating bandwidth.

17. The apparatus of claim 12, the means for amplifying comprising means for amplifying using four amplifier stages and the two or more interleaved feedback paths comprising an interleaved double feedback having a first feedback element coupled between an output of a fourth amplifier stage and an input of a second amplifier stage, and a second feedback element coupled between an output of a third amplifier stage and an input of a first amplifier stage.

18. The apparatus of claim 12, further comprising means for input matching that provides electrostatic discharge (ESD) protection.

19. The apparatus of claim 12, further comprising means for output matching that provides ESD protection.

20. The apparatus of claim 12, further comprising:
means for providing a selected feedback element coupled across an even number of amplifier stages; and
means for phase shifting coupled between the selected feedback element and a selected amplifier stage, the means for phase shifting configured to introduce a selected amount of phase shift to cause the selected feedback element to act as if coupled around a selected odd number of amplifier stages.

21. An apparatus comprising:
a plurality of amplifier stages coupled together to receive a millimeter (MM) wave input signal and produce an amplified MM wave output signal, the plurality of amplifier stages comprising four amplifier stages; and
one or more feedback elements coupled across an odd number of the amplifier stages to increase an operating bandwidth, the feedback elements comprising an interleaved double feedback having a first feedback network coupled between an output of a fourth stage and an input of a second stage, and a second feedback network coupled between an output of a third stage and an input of a first stage.

22. The apparatus of claim 21, the first feedback element and the second feedback element selected to provide a loop gain less than zero.

23. The apparatus of claim 21, the first feedback element and the second feedback element comprising fixed resistors having resistance values set to achieve a desired operating bandwidth.

24. An apparatus comprising:
a plurality of amplifier stages coupled together to receive a millimeter (MM) wave input signal and produce an amplified MM wave output signal;
one or more feedback elements coupled across the amplifier stages, each feedback element coupled across an odd number of the amplifier stages to increase an operating bandwidth;
a selected feedback element coupled across an even number of the amplifier stages; and
a phase shifter coupled between the selected feedback element and a selected amplifier stage, the phase shifter configured to introduce a selected amount of phase shift to cause the selected feedback element to act as if coupled around a selected odd number of the amplifier stages.

* * * * *